United States Patent
Lin (10) Patent No.: US 10,439,170 B2
(45) Date of Patent: Oct. 8, 2019

(54) MULTI-LAYER MASK

(71) Applicant: I-Yi Lin, Hsinchu (TW)

(72) Inventor: I-Yi Lin, Hsinchu (TW)

( * ) Notice: Subject to any disclaimer, the term of this patent is extended or adjusted under 35 U.S.C. 154(b) by 0 days.

(21) Appl. No.: 16/033,173

(22) Filed: Jul. 11, 2018

(65) Prior Publication Data

US 2019/0019994 A1    Jan. 17, 2019

(30) Foreign Application Priority Data

Jul. 12, 2017   (TW) .............................. 106123343 A (51) Int. Cl.
  *H01L 51/56*    (2006.01)
  *C23C 14/04*    (2006.01)
  *H01L 51/00*    (2006.01)

(52) U.S. Cl.
  CPC ............ *H01L 51/56* (2013.01); *C23C 14/042* (2013.01); *H01L 51/001* (2013.01); *H01L 51/0011* (2013.01)

(58) Field of Classification Search
  None
  See application file for complete search history.

(56) References Cited

U.S. PATENT DOCUMENTS

2004/0202821 A1*  10/2004  Kim .................. B32B 3/266
                                                        428/137
2009/0267507 A1*  10/2009  Takashima .......... H01L 51/0011
                                                        313/511

* cited by examiner

*Primary Examiner* — Jethro M. Pence (57) ABSTRACT

A multi-layer mask includes a metal frame, at least a first metal foil and at least a second foil. The first metal foil is fixed in the metal frame and includes plural first opening areas. The second foil is superimposed on the first metal foil and fixed in the metal frame. The second foil includes plural second opening areas and at least a honeycomb structure, and each second opening area is composed of plural second opening areas. When the second foil is superimposed on the first metal foil, the second opening area is superimposed on the first opening area, and the honeycomb structure is not superimposed on the first opening area. The multi-layer mask of this disclosure improves the deformation or crack of the image opening with a small spacing and achieves a high production yield of high-resolution OLED panels.

8 Claims, 7 Drawing Sheets

MULTI-LAYER MASK

BACKGROUND OF THE INVENTION

Field of the Invention

The present disclosure relates to a multi-layer mask, in particular to the multi-layer mask used in an OLED panel evaporation process.

Description of Related Art

Figure 1:
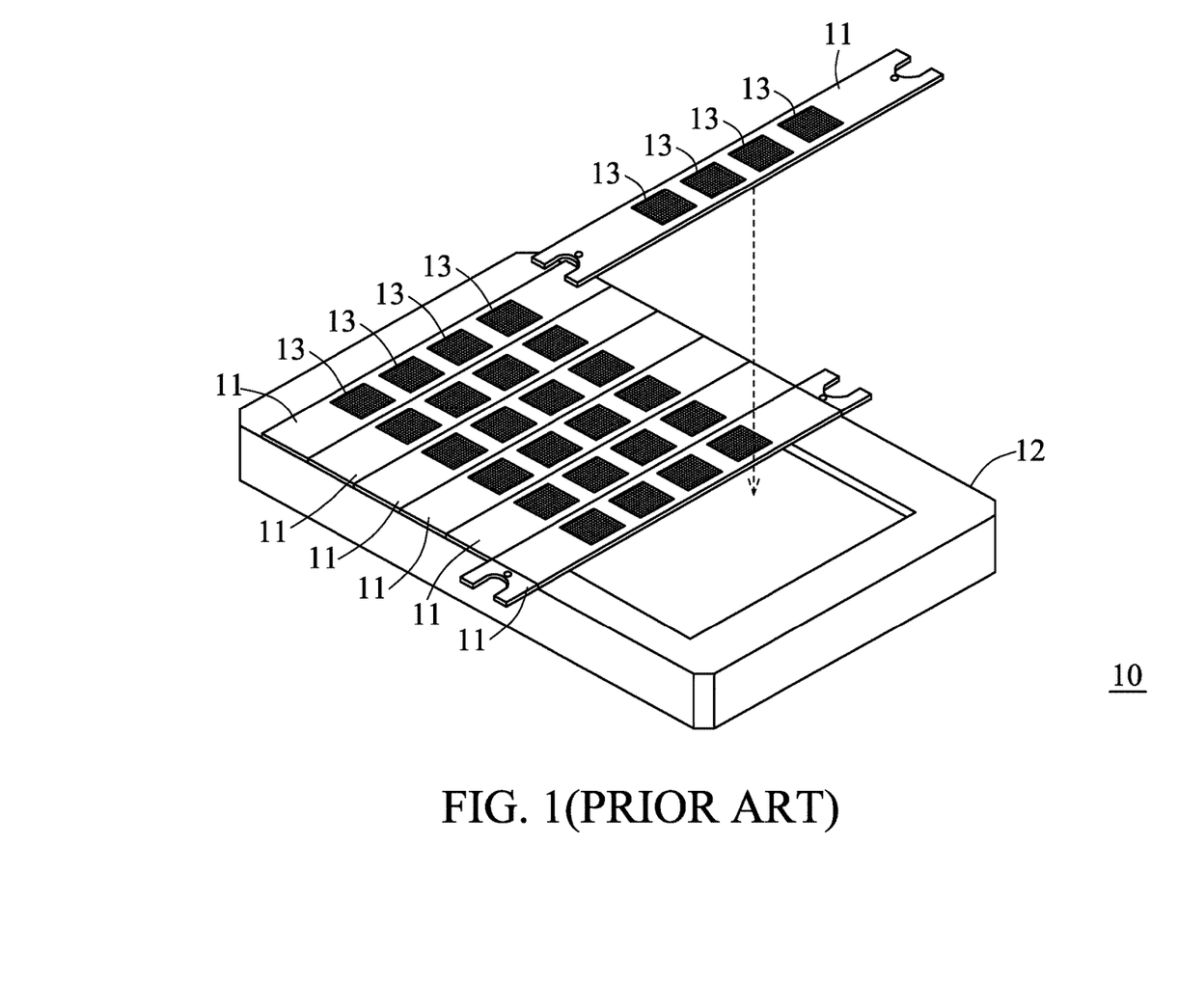
FIG. 1 is a schematic view of a metal mask 10 of this disclosure.

With reference to FIG. 1 for a schematic view of a metal mask 10 of this disclosure, an organic light emitting diode (OLED) panel regarded as a next generation panel has the features of self-illumination, wide viewing angle, high contrast, high reaction rate, high color saturation, etc, and thus the world has high hopes for OLED panels. At present, the vacuum evaporation process is a main technology used for producing OLED panels. In this technology, a material of gasification (such as an organic or metal material) is placed into a crucible for heating, and the crucible is heated to sublimate the material of gasification at a highly vacuum condition, so that the material of gasification is deposited on a specific substrate 8 to form a uniform thin film. In addition, a metal mask 10 with an image opening is placed at a substrate (not shown in the figure) for controlling the distribution of the material of gasification. Specifically, the material of gasification will only be deposited onto an area of the substrate where the metal mask 10 is not covered, and the required pattern will be formed on the substrate.

The metal mask 10 comprises a plurality of metal foils 11 and a metal frame 12, and the metal foil 11 has a plurality of opening areas 13, each being composed of a plurality of image openings 130. To prevent a sagging deformation of the metal foil 11 caused by gravity, a parallel tension is applied to the metal foil 11 to maintain a flat surface, and then the metal foil 11 is fixed to the metal frame 12. Wherein, the metal foil 11 is manufactured by electroforming or chemical etching, and then a mechanical stretcher is used to apply the parallel tension to both ends of each metal foil 11 to achieve the parallel tension. After a flat surface of the metal foil 11 is formed, the metal foil 11 is aligned precisely with the metal frame 12, and then each metal foil 11 is fixed to the metal frame 12 by laser welding to complete the whole metal mask 10. This manufacturing process is a conventional mechanical stretching process commonly used in the related industry. In the vacuum evaporation process of OLEDs, the upper edge of the metal foil 11 must be flatly and tightly attached to the lower edge of the substrate in order to meet the high-precision production requirement. Therefore, the control of tension in the mechanical stretching process is an important factor of forming the flat surface of the metal foil 11. However, the metal foil 11 may become a non-uniform foil easily due to the image opening 130 in the opening area 13 of the metal foil 11, so that the stress will be non-uniform or concentrated at particular positions during the tension stretching process. As a result, the metal foil 11 may have an edge warping or a deformation of the image opening 130, and thus making the mechanical stretching process more difficult.

If a thicker metal foil 11 or an image opening 130 with larger spacing is used, then the aforementioned edge warping or deformation of the image opening 130 occurred during the mechanical stretching process of the metal foil 11 will be reduced. However, the thicker metal foil 11 results in a larger dead space which causes a more significant shadow effect in the vacuum evaporation process, and high-resolution OLED panel cannot be produced.

In addition, if the metal mask 10 is used for producing the high-resolution OLED panel, then the spacing of the image opening 130 of the metal foil 11 will become smaller, so as to achieve a high-resolution display quality. However, the image opening 130 with a small spacing will weaken the overall structural strength of the metal foil 11. With the same condition of tension, the image opening 130 with the small spacing may be deformed, cracked or broken easily, so that a high-resolution OLED panel cannot be produced.

In addition, most of the conventional metal masks 10 are made of a nickel, iron, cobalt related metal alloy, so that if the temperature is higher than 60 degrees Centigrade, then the thermal expansion or deformation of the metal foil 11 will also become another technical bottleneck of enhancing the resolution of the OLED panel.

Therefore, it is an important subject for related high-resolution OLED panel manufacturers to produce a flat surface of the metal foil and prevent the deformation or crack of the image opening having a small spacing during the mechanical stretching process in order to produce the high-resolution OLED panel.

SUMMARY OF THE INVENTION

Therefore, it is a primary objective of this disclosure to overcome the aforementioned drawbacks of the prior art by providing a multi-layer mask capable of improving the issue of having a deformation or crack of the image opening of the multi-layer mask with a small spacing, and facilitating the production of the high-resolution OLED panel.

The multi-layer mask of this disclosure comprises a metal frame, at least a first metal foil and at least a second foil. The first metal foil is fixed in the metal frame and includes a plurality of first opening areas. The second foil is superimposed on the first metal foil and includes a plurality of second opening areas, and each second opening area is composed of a plurality of second opening areas. Wherein, when the second foil is superimposed on the first metal foil, the second opening area is superimposed on the first opening area.

In the multi-layer mask, the second foil further comprises at least a honeycomb structure, wherein when the second foil is superimposed on the first metal foil, the honeycomb structure will not be superimposed on the first opening area.

In the multi-layer mask, the honeycomb structure of the second foil is a regular hexagonal honeycomb structure, a unilateral concave hexagonal honeycomb structure, or an opposite-side concave hexagonal honeycomb structure.

In the multi-layer mask, at least a rib is included between two adjacent first opening areas of the first metal foil.

In the multi-layer mask, the rib has a cross-section substantially V-shaped or U-shaped.

The multi-layer mask further comprises at least a coating coated on an upper surface of the second foil.

In the multi-layer mask, coating is a magnetic iron-nickel alloy thin-layer.

In the multi-layer mask, the first metal foil is an INVAR alloy (which is special steel with a nickel content of 36%), and the first metal foil has a thickness smaller than 25 um.

In the multi-layer mask, the second foil is made of an INVAR alloy (which is special steel with a nickel content of 36%) or an engineering plastic thin film having a linear thermal expansion coefficient smaller than 10 ppm/° C. and the second foil has a thickness smaller than 10 um.

In the multi-layer mask, when the second foil is the engineering plastic thin film, a magnetic coating is required.

In the multi-layer mask, the engineering plastic thin film is polyimide (PI).

DESCRIPTION OF THE INVENTION

To understand the technical characteristics of this disclosure intuitively and comprehensively, exemplary embodiments are used and illustrated in referenced figures of the drawings. It is intended that the embodiments and figures disclosed herein are to be considered illustrative rather than restrictive.

Figure 2A:
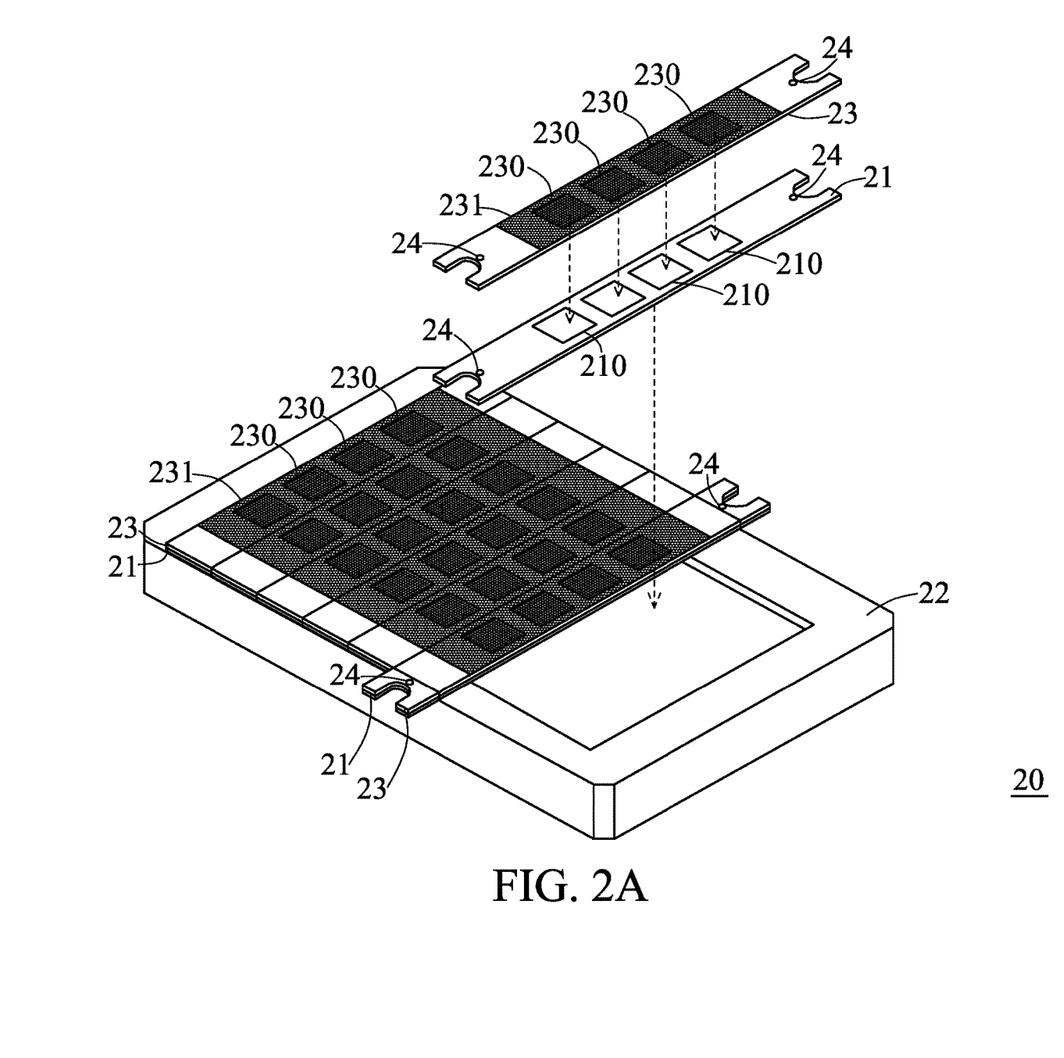
FIG. 2A is an exploded view of a multi-layer mask 20 in accordance with a first embodiment of this disclosure.
Figure 2B:
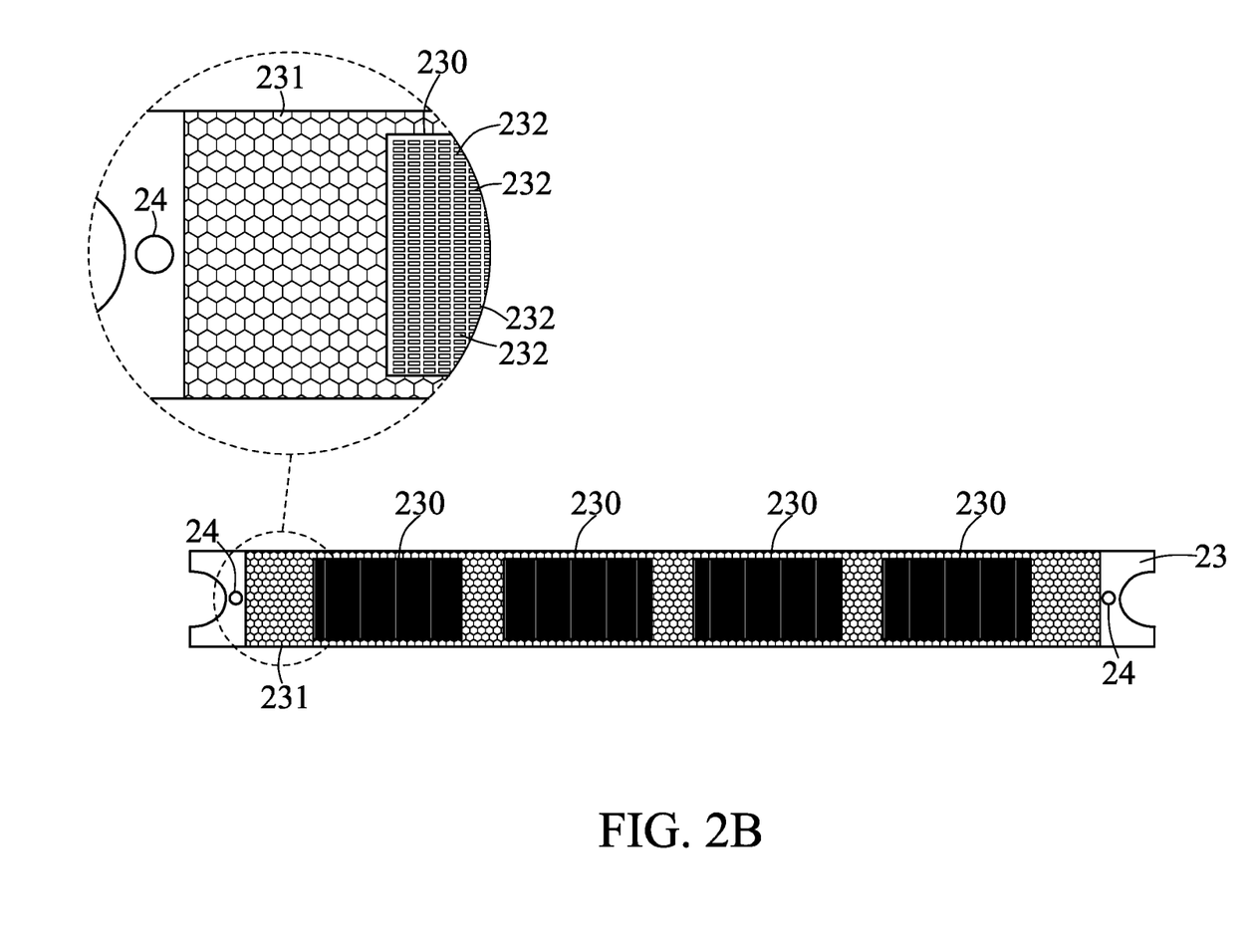
FIG. 2B is a blowup view of a honeycomb structure in accordance with a first embodiment of this disclosure.

With reference to FIGS. 2A and 2B for an exploded view of a multi-layer mask 20 and a blowup view of a honeycomb structure 231 in accordance with the first embodiment of this disclosure respectively, the multi-layer mask 20 comprises a metal frame 22, a plurality of first metal foils 21 and a plurality of second foils 23. Wherein, the first metal foil 21 is fixed in the metal frame 22 and includes a plurality of first opening areas 210, wherein the first metal foil is an INVAR alloy (which is special steel with a nickel content of 36%), and the first metal foil 21 has a thickness smaller than 25 um. In addition, the second foil 23 is superimposed on the first metal foil 21, wherein the second foil is an INVAR alloy (which is special steel with a nickel content of 36%). The second foil 23 includes a plurality of second opening areas 230 and at least a honeycomb structure 231, and each second opening area 230 is composed of a plurality of second opening areas 232. When the second foil 23 is superimposed on the first metal foil 21, the second opening area 230 will be superimposed on the first opening area 210, and the honeycomb structure 231 will not be superimposed on the first opening area 210. Therefore, the first metal foil 21 can cover the honeycomb structure 231. Both of the first metal foil 21 and second foil 23 have a plurality of alignment hole 24, and when the second foil 23 is superimposed on the first metal foil 21, the alignment holes 24 are provided for aligning the first metal foil 21 and second foil 23 with the mechanical stretcher.

Figure 3:
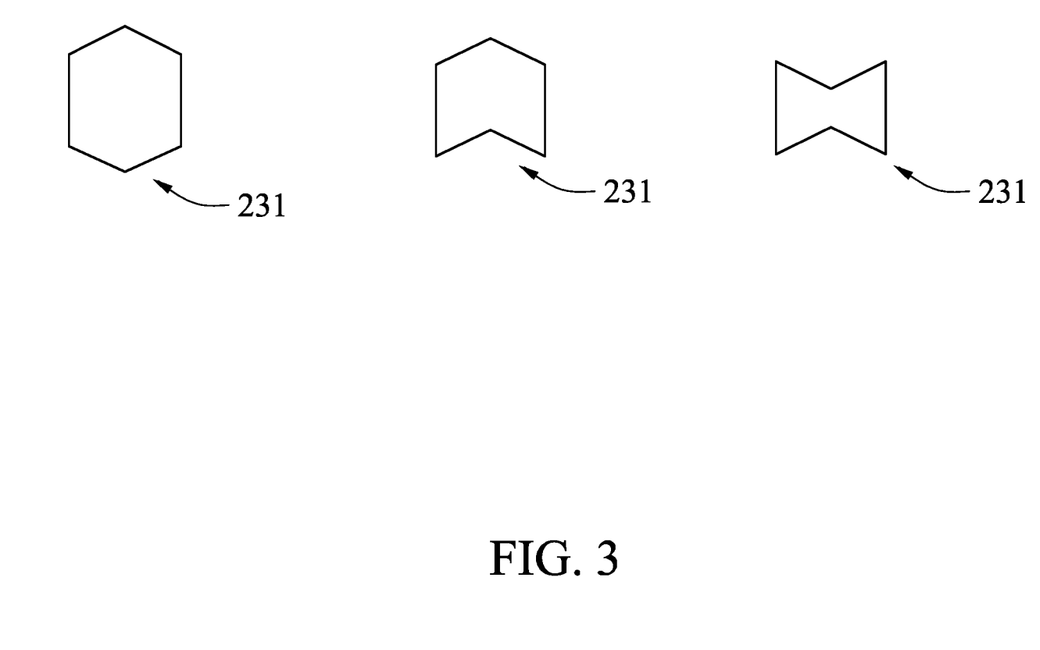
FIG. 3 is a schematic view of a honeycomb structure in a different form in accordance with the first embodiment of this disclosure.

With reference to FIG. 3 for a schematic view of a honeycomb structure 231 in a different form, the honeycomb structure 231 is a grid structure of Poisson's ratio, and the honeycomb structure 231 may be in form of a regular hexagonal honeycomb structure, a unilateral concave hexagonal honeycomb structure or an opposite-side concave hexagonal honeycomb structure (as shown in FIG. 3). During the tension stretching process of the second foil 23, the honeycomb structure 231 can reduce the deformation occurred in a non-force exerting direction, so that the edge warping of the second foil 23 or the deformation of the second image opening 232 will not occur easily.

Since the second foil 23 is superimposed on the first metal foil 21, therefore the tension of the first metal foil 21 fixed to the metal frame 12 provides sufficient support to the second foil 23 during the mechanical stretching process of the first metal foil 21. Therefore, manufacturers just need to take the details of the second image opening 232 of the second foil 23 into consideration, but have no need to consider the sagging deformation of the second image opening 232). In other words, the second foil 23 may be made of an engineering plastic thin film with a low thermal expansion coefficient, such as the engineering plastic thin film with a linear thermal expansion coefficient smaller than 10 ppm/° C., and the thickness of the second foil 23 may be smaller than 10 um. As a result, a fine second image opening 232 can be formed to produce a high-resolution OLED panel. The engineering plastic thin film of the second foil 22 is polyimide (PI). The material of the second foil 22 of this disclosure is not limited to the engineering plastic thin film only, but it may be a metal material commonly used in the related industry as well.

Figure 4A:
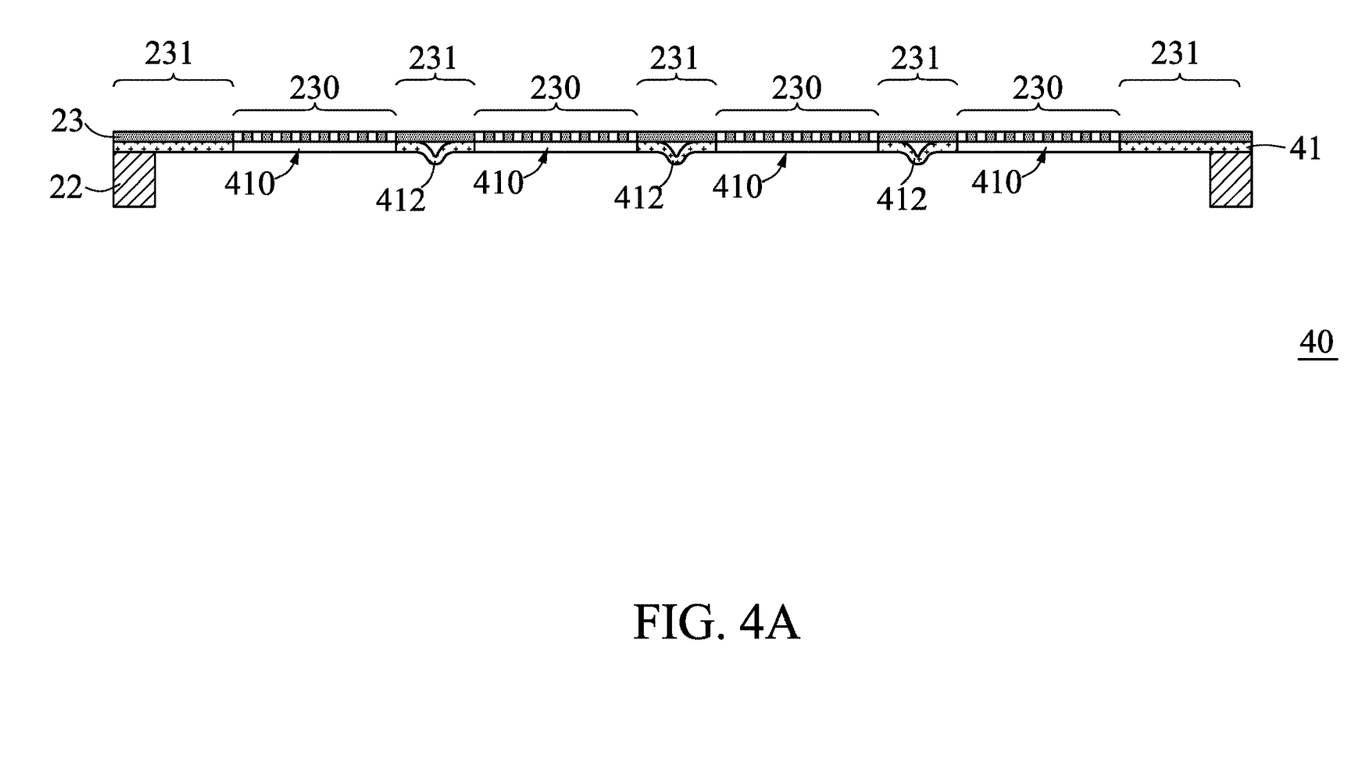
FIG. 4A is a schematic view of a multi-layer mask 40 in accordance with a second embodiment of this disclosure.
Figure 4B:
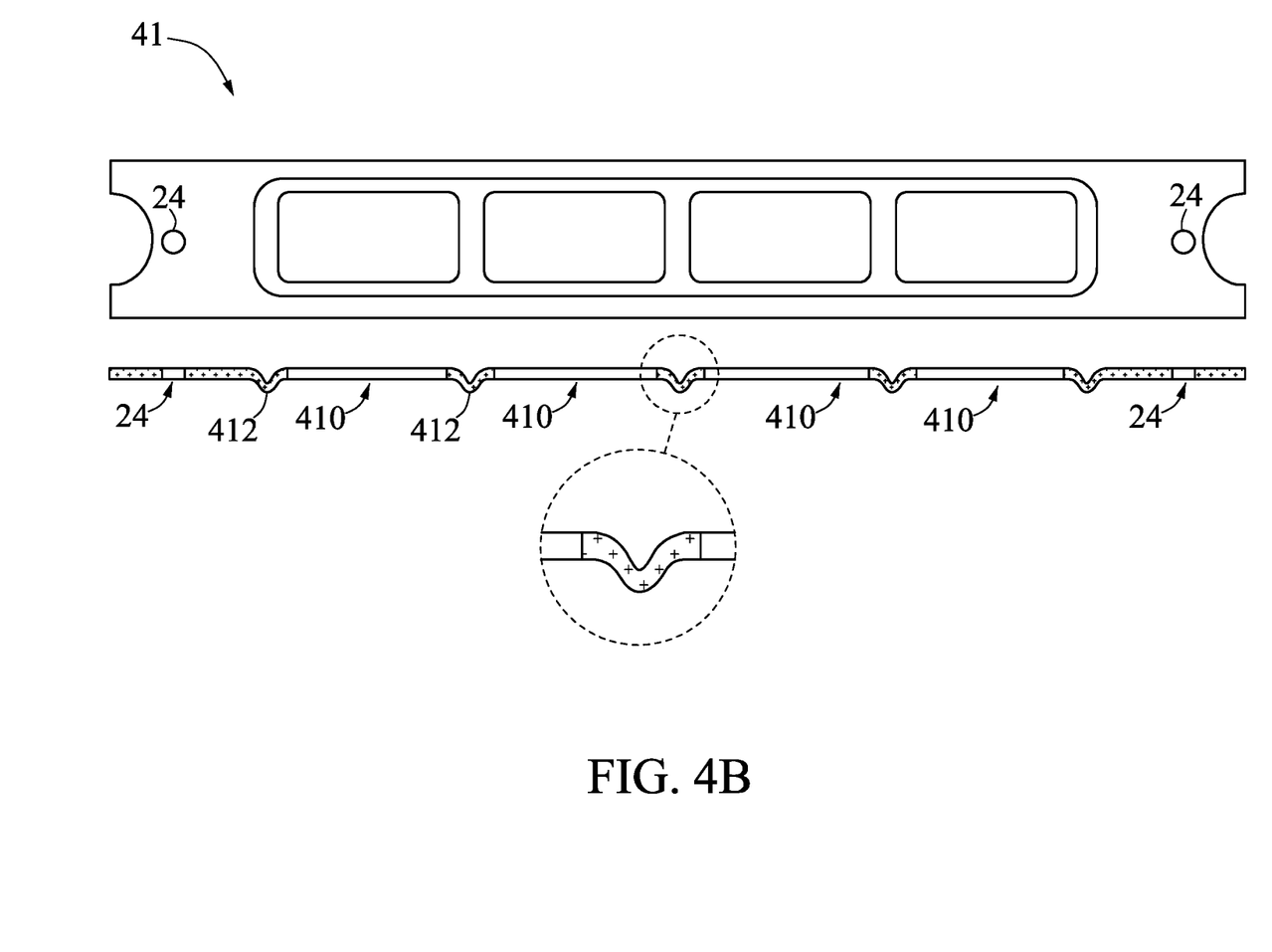
FIG. 4B is a schematic view of a first metal foil 41 in accordance with the second embodiment of this disclosure.

With reference to FIGS. 4A and 4B for the schematic views of a multi-layer mask 40 and a first metal foil 41 in accordance with the second embodiment of this disclosure respectively, the difference between the multi-layer mask 40 and the multi-layer mask 20 resides on that a rib 412 is included between two adjacent first opening areas 410 of the first metal foil 41 of the multi-layer mask 40. Wherein, the rib 412 has a V-shaped or U-shaped cross-section (FIG. 4B shows the rib 412 having a V-shaped cross-section). Before the process of manufacturing the first opening area 410 of first metal foil 41, it is necessary to avoid the part of the first opening area 410 and form a pattern or a line (which is the rib 412) on a surface in the area other than the first opening area 410, and then manufacture the first opening area 410. When structure can be enhanced at the periphery of the first metal foil 41 by the V-shaped or U-shaped rib 412 to resist a large tension. In addition, the rib 412 also reduces the sagging deformation of the first metal foil 41 caused by gravity and the required tension for compensating the sagging deformation. When the rib 412 enhances the strength of the first metal foil 41, the first metal foil 41 can support the second foil 23 above. As a result, the overall structural strength of the multi-layer mask 40 is enhanced.

Figure 5:
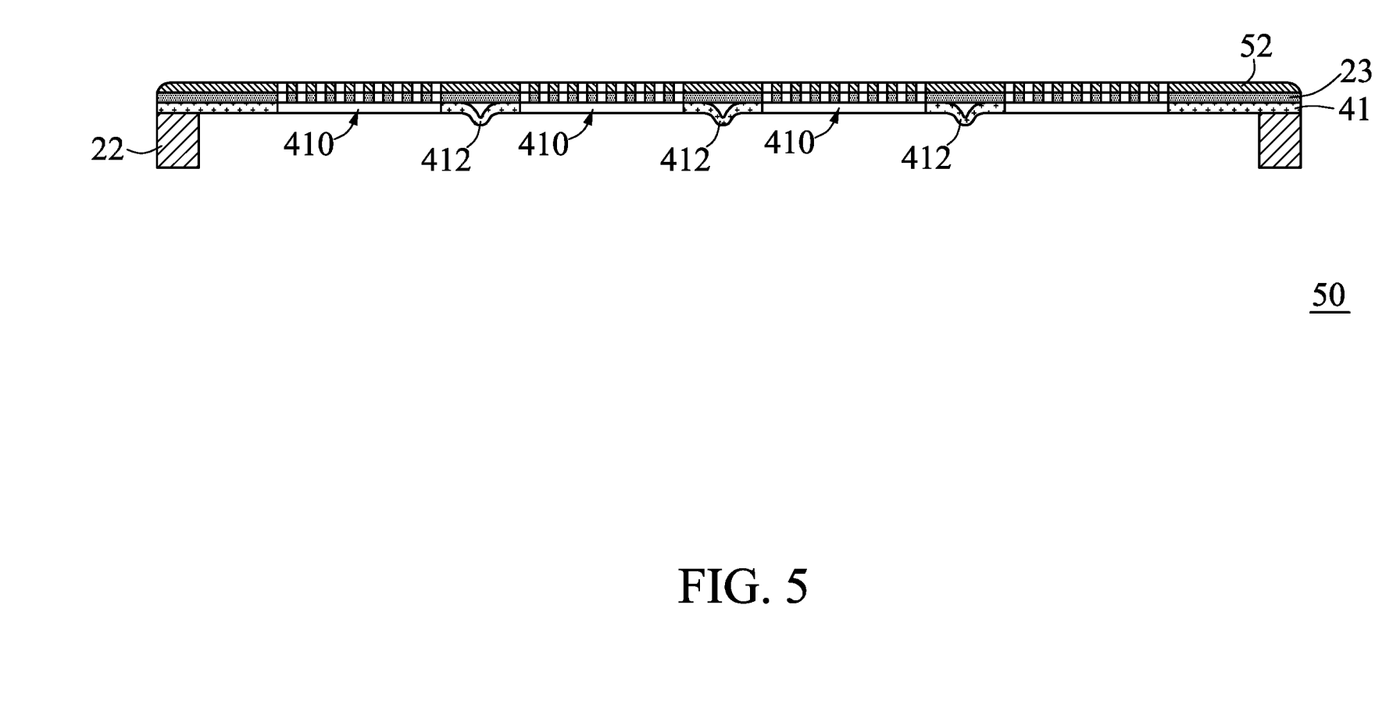
FIG. 5 is a schematic view of a multi-layer mask 50 in accordance with a third embodiment of this disclosure.

With reference to FIG. 5 for a multi-layer mask 50 in accordance with the third embodiment of this disclosure, the difference between the multi-layer mask 50 and the multi-layer mask 40 resides on that the multi-layer mask 50 further comprises at least a coating 52 coated on an upper surface of the second foil 23. Specifically, the coating 52 is coated on the second opening area 230 and the honeycomb structure 231, wherein the coating 52 may be a magnetic iron-nickel alloy thin-layer. To attach the substrate and the metal mask tightly with each other, the conventional evaporation machine generally adopts an electromagnetic mechanism to attach the metal mask closely to the substrate. Therefore, the magnetic coating 52 (such as an iron-nickel alloy thin-layer) can help attaching the multi-layer mask 50 by the electromagnetic mechanism In summation of the description above, the multi-layer mask of this disclosure prevents the deformation or crack of the image opening by the multi-layer foil structure and the honeycomb structure and also uses an image opening having a small spacing. The multi-layer mask of this disclosure is used for achieving the required production yield of the high-resolution OLED panel.

While this disclosure has been described by means of specific embodiments, numerous modifications and variations could be made thereto by those skilled in the art without departing from the scope and spirit of the invention set forth in the claims.

What is claimed is:

1. A multi-layer mask, comprising:
   a metal frame;
   at least a first metal foil, fixed in the metal frame, and including a plurality of first opening areas; and
   at least a second foil, superimposed on the first metal foil, and including a plurality of second opening areas and at least a honeycomb structure, and each of the plurality of second opening areas composed of a plurality of second openings;
   wherein the second foil is superimposed on the first metal foil, the plurality of second opening areas is superimposed on the plurality of first opening areas, and the position of the honeycomb structure is not superimposed on the plurality of first opening areas.

2. The multi-layer mask of claim 1, wherein the honeycomb structure is a regular hexagonal honeycomb structure, a unilateral concave hexagonal honeycomb structure or opposite-side concave hexagonal honeycomb structure.

3. The multi-layer mask of claim 1, further comprising at least a rib disposed between two adjacent first opening areas of first metal foil.

4. The multi-layer mask of claim 3, wherein the first metal foil rib has a cross-section in V-shaped or U-shaped.

5. The multi-layer mask of claim 1, further comprising at least a coating coated on an upper surface of the second foil.

6. The multi-layer mask of claim 5, wherein the coating is a magnetic iron-nickel alloy thin-layer.

7. The multi-layer mask of claim 1, wherein the first metal foil is a nickel-iron alloy and has a thickness smaller than 25 um.

8. The multi-layer mask of claim 1, wherein the second foil is a nickel-iron alloy or an engineering plastic thin film having a linear thermal expansion coefficient smaller than 10 ppm/° C. and a thickness smaller than 10 um.

* * * * *